US006904065B2

(12) United States Patent
Wesström

(10) Patent No.: US 6,904,065 B2
(45) Date of Patent: Jun. 7, 2005

(54) METHOD AND APPARATUS FOR COMPENSATING LOSSES IN A TUNABLE LASER FILTER

(75) Inventor: Jan-Olof Wesström, Stockholm (SE)

(73) Assignee: ADC Telecommunications, Inc., Eden Prairie, MN (US)

(*) Notice: Subject to any disclaimer, the term of this patent is extended or adjusted under 35 U.S.C. 154(b) by 0 days.

(21) Appl. No.: 10/080,492

(22) Filed: Feb. 22, 2002

(65) Prior Publication Data

US 2002/0114373 A1 Aug. 22, 2002

(30) Foreign Application Priority Data

Feb. 22, 2001 (SE) .............................................. 0100611

(51) Int. Cl.[7] ................................................. H01S 3/10
(52) U.S. Cl. .............................. 372/20; 372/43; 372/45; 372/102; 385/40
(58) Field of Search ........................... 372/20, 45, 102; 385/40, 14, 27, 37, 42, 129, 9

(56) References Cited

U.S. PATENT DOCUMENTS

| 4,923,264 A | 5/1990 | Langer et al. |
| 5,022,730 A | 6/1991 | Cimini et al. |

(Continued)

FOREIGN PATENT DOCUMENTS

| EP | 0 314 490 | 5/1989 |
| EP | 0 386 797 | 9/1990 |
| EP | 0 466 082 A2 | 1/1992 |
| EP | 0 926 787 A1 | 6/1999 |
| JP | 05188412 A | 7/1993 |
| WO | WO 99/66664 | 12/1999 |

OTHER PUBLICATIONS

Öberg et al., "74 nm Wavelength Tuning Range of an InGaAsP/InP Vertical Grating Assisted Codirectional Coupler Laser with Rear Sampled Grating Reflector", *IEEE Photonics Technology Letters*, Jul. 1993, vol. 5, No. 7, pp. 735–738, XP002199007, ISSN: 1041–1135.

Alferness et al, "Broadly tunable InGaAsP/InP buried rib waveguide vertical coupler filter", *Applied Physics Letter*, American Institute of Physics, New York, US, Feb. 24, 1992, vol. 60, No. 8, pp 980–982, XP000292179, ISSN: 0003–6951.

Alferness et al. "Broadly tunable InGaAsP/InP laser based on a vertical coupler filter with 57–nm tuning range", *Applied Physics Letter*, American Institute of Physics, New York, US, Jun. 29, 1992, vol. 60, No. 26, pp 3209–3211, XP000281257, ISSN: 0003–6951.

International Search Report for PCT/IB02/00535.
International Search Report for PCT/IB02/00536.

*Primary Examiner*—Minsun Oh Harvey
*Assistant Examiner*—Dung Nguyen
(74) *Attorney, Agent, or Firm*—Carlson, Caspers, Vandenburgh & Lindquist

(57) ABSTRACT

An approach for compensating for losses in a tunable laser filter comprising includes providing a tunable waveguide material and an amplifying material that have different compositions. The tuning material and the amplifying material are placed parallel to one another. The amplifying material is disposed so that it covers the tuning material at discrete locations. Carriers are injected simultaneously into both materials. The tuning material is spaced from the amplifying material at an average distance that is greater than the charge carrier diffusion length, so as to reduce avoid diffusion of charge carriers from the tuning material into the amplifying material. This prevents the amplifying material draining the charge carriers out of the tuning material, thus enabling the refractive index of the tuning material to be tuned for a desired wavelength effect.

26 Claims, 5 Drawing Sheets

U.S. PATENT DOCUMENTS

| | | |
|---|---|---|
| 5,131,060 A | 7/1992 | Sakata |
| 5,140,149 A | 8/1992 | Sakata et al. |
| 5,253,314 A * | 10/1993 | Alferness et al. ............. 385/40 |
| 5,333,216 A | 7/1994 | Sakata et al. |
| 5,416,866 A | 5/1995 | Sahlen |
| 5,559,912 A | 9/1996 | Agahi et al. |
| 5,613,020 A * | 3/1997 | Uchida et al. ................. 385/9 |
| 5,699,378 A * | 12/1997 | Lealman et al. ............ 372/102 |
| 5,926,493 A * | 7/1999 | O'Brien et al. ................ 372/45 |
| 5,937,129 A | 8/1999 | Jeong et al. |
| RE36,710 E | 5/2000 | Baets et al. |
| 6,101,302 A * | 8/2000 | Park et al. .................... 385/37 |
| 6,198,863 B1 * | 3/2001 | Lealman et al. ............. 385/37 |
| 6,330,378 B1 * | 12/2001 | Forrest et al. ................ 385/14 |
| 6,421,363 B1 * | 7/2002 | Osinski et al. ................ 372/50 |
| 6,665,474 B2 | 12/2003 | Wesstrom |

* cited by examiner

METHOD AND APPARATUS FOR COMPENSATING LOSSES IN A TUNABLE LASER FILTER

This application claims priority from Swedish application 0100611-3, filed on Feb. 22, 2001, and which is incorporated herein by reference.

FIELD OF THE INVENTION

The present invention relates to a method of compensating for losses in a tunable laser filter, and also to such a filter.

BACKGROUND

Electric current is injected into a tunable filter to change the concentration of charge carriers, therewith changing the refractive index and, in turn, determining the centre frequency of the filter. Bragg filters and coupler filters are examples of such filters. Phase delay sections also function in accordance with the same principle.

One problem with elevating the concentration of charge carriers is that optical losses will also increase as a result of the absorption of free charge carriers. This increase in losses results in a reduction in transmission through the filter, which is often disadvantageous.

One solution is to use a semi-active material as tunable material, where increased absorption of charge carriers occurring when current is injected into the semi-active waveguide is caused to be essentially compensated for by amplification in the waveguide, this being achieved by choosing in the semi-active waveguide a material that will provide a sufficiently high amplification or gain.

One problem with semi-active material is that the amplification in this material takes place by stimulated emission, wherewith the optical power influences the number of charge carriers that remain in the material, i.e. free charge carriers. When the charge carriers interact too strongly with the optical field, too many charge carriers recombine and therewith cause an excessive reduction in charge carrier density, so as to make tuning of the filter impossible to achieve.

It may be difficult to decide an optimal interaction between the optical field and the charge carriers. This optimum depends on many variables, for instance the magnitude of the optical power prevailing in the laser at that moment in time.

SUMMARY OF THE INVENTION

This problem is addressed by the present invention, which relates to an approach for compensating for losses in a tunable laser filter comprising a tunable material and an amplifying material where said materials have mutually different compositions. The tuning material and the amplifying material are placed parallel to one another. The amplifying material is disposed so that it covers the tuning material at discrete locations. Carriers are injected simultaneously into both materials. The tuning material is spaced from the amplifying material at an average distance that is greater than the charge carrier diffusion length, so as to reduce avoid diffusion of charge carriers from the tuning material into the amplifying material. This prevents the amplifying material draining the charge carriers out of the tuning material, thus enabling the refractive index of the tuning material to be tuned for a desired wavelength effect.

One particular embodiment of the invention is directed to a method of compensating for losses in a tunable laser filter that includes a waveguide formed from tunable material and an amplifying material disposed in a parallel relationship with the tunable material. The tuning and amplifying materials having different compositions. The method includes injecting charge carriers into the tunable material and amplifying material simultaneously so that the amplifying material provides gain to light propagating along the tunable material waveguide and so that the refractive index of the tunable material is changed to a desired value.

Another embodiment of the invention is directed to a tunable laser filter that includes a tunable waveguide formed from a tuning material, and an amplifying material, having a composition different from the composition of the tuning material, disposed in a parallel relationship with the tunable waveguide. The amplifying material amplifies light propagating along the tunable waveguide.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
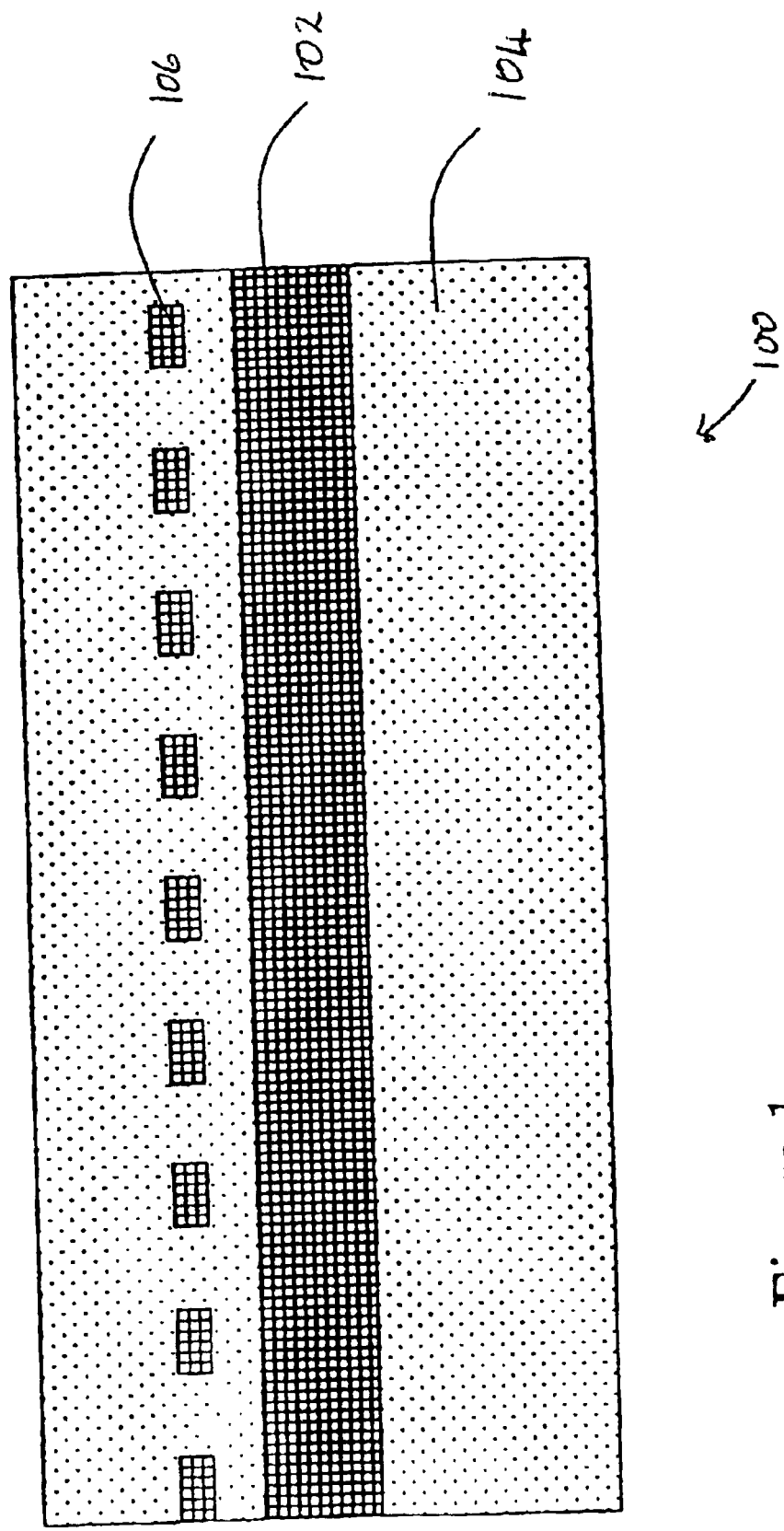
FIG. 1 schematically illustrates a Bragg reflector.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Figure 2:
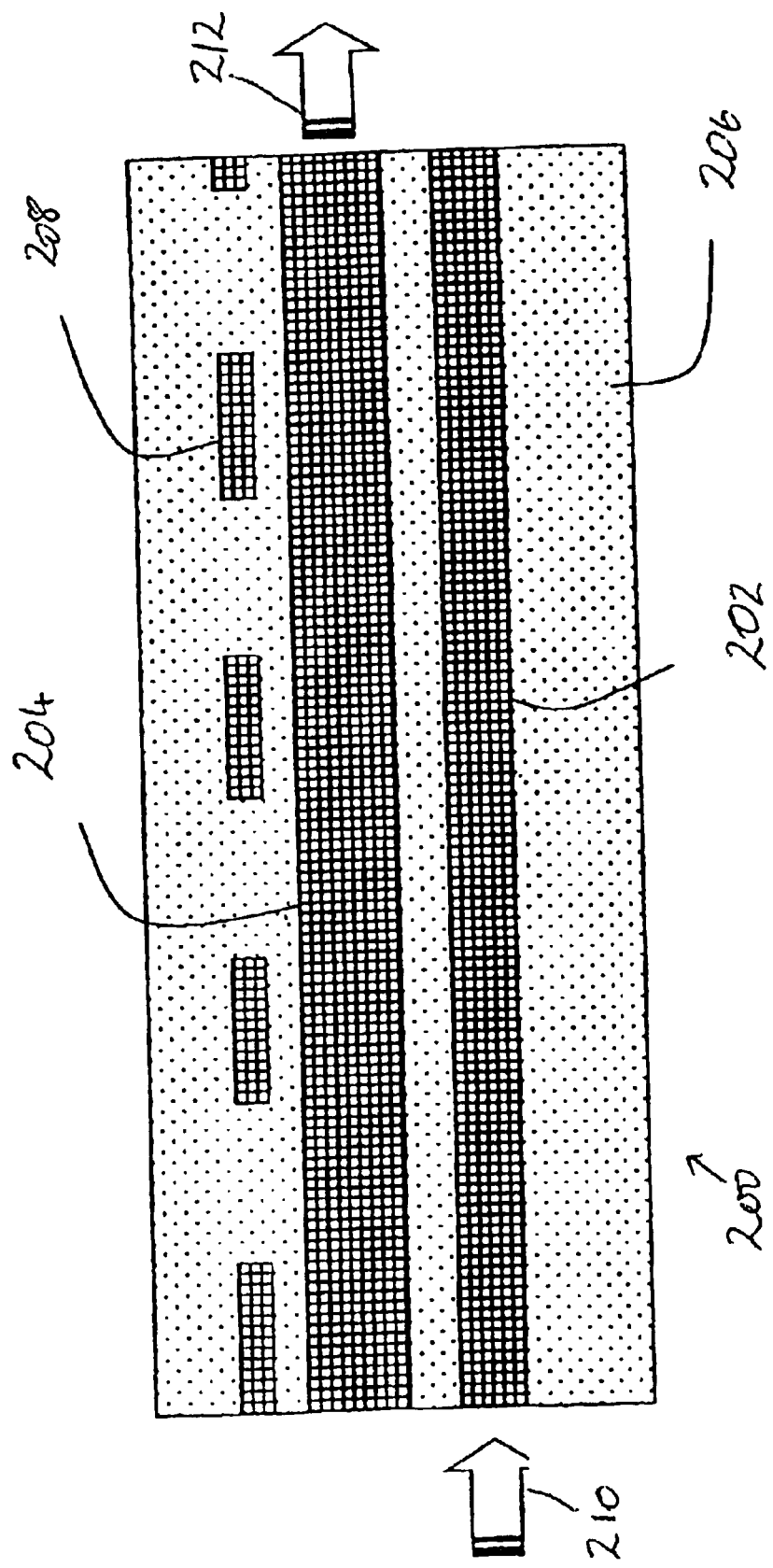
FIG. 2 schematically illustrates a coupler filter.

A waveguide Bragg reflector 100 is schematically illustrated in FIG. 1. Light enters the structure, for example, from the left and is guided into the waveguide layer 102, which is surrounded by a material 104. The light, at a given optical frequency, is reflected by a periodic grating 106. The reflector 100 may be tuned, so that reflection takes place for light of a selected frequency, by injecting charge carriers into the layer 102, thereby changing the refractive index of layer 102. When the reflector operates with a wavelength of around 1.55 µm, indium phosphide (InP) is a commonly selected material for the region 104. The material in regions 102 and 106 is often selected to be an alloy of indium gallium arsenide phosphide, $In_{(1-X)}Ga_XAs_YP_{(1-Y)}$, which may be lattice matched to InP. The photoluminescence wavelength of the $In_{(1-X)}Ga_XAs_YP_{(1-Y)}$ material is commonly shorter than A directional coupler filter 200 is schematically illustrated in FIG. 2. Light may enter the filter 200, for example, at 210 and is guided first by the waveguide layer 202 surrounded by a material 206. The light, at a selected optical frequency, is coupled into a second waveguide 204, such coupling being aided by a grating layer 208. The light, at the selected frequency, exits from coupler at 212. The coupler may be tuned so that maximum coupling occurs for different frequency by injecting charge carriers into the layer 204, for instance, so as to change the refractive index of layer 204.

When the coupler is intended to function for light having a wavelength of about 1.55 μm, the material for region 206 is often chosen to be InP. The materials for waveguides 202 and 204 is often chosen to be $In_{(1-X)}Ga_XAs_YP_{(1-Y)}$, which may be lattice matched to InP. Typically the InGaAsP material has photoluminescence wavelength shorter than λ=1.4 μm.

Figure 3:
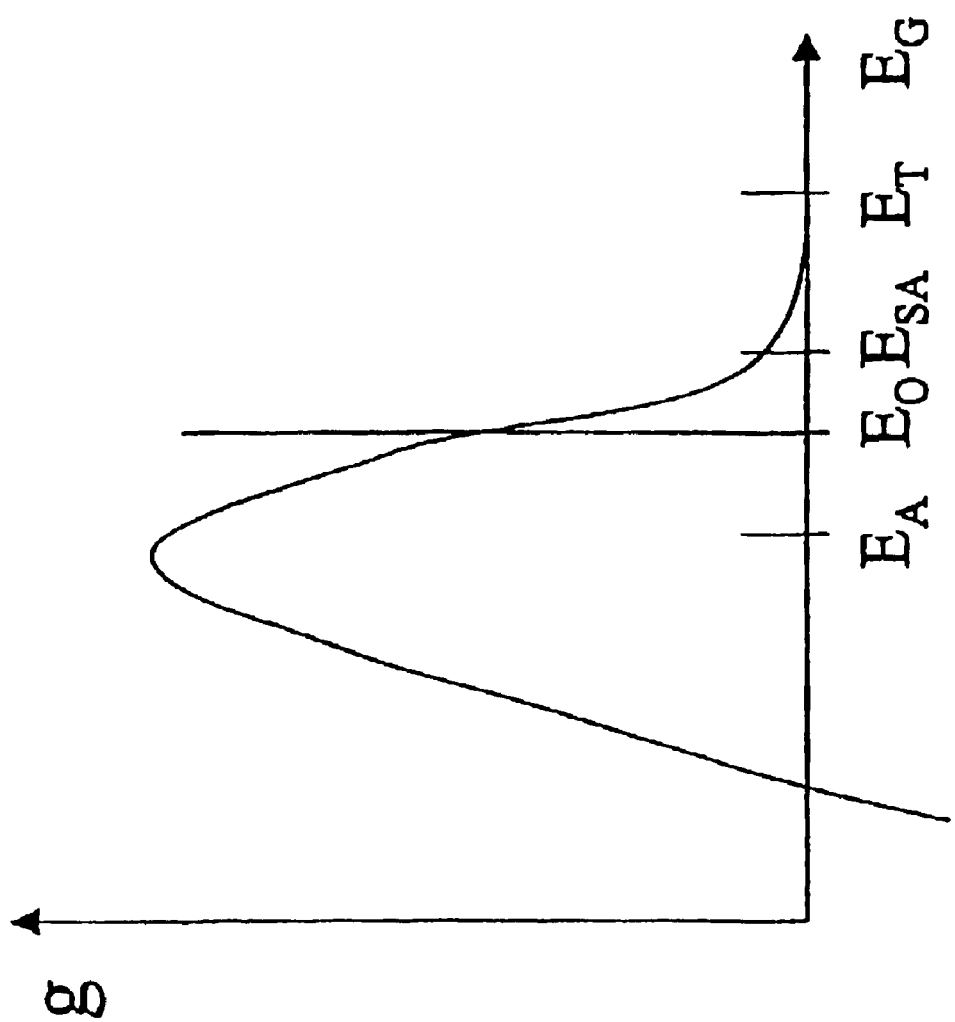
FIG. 3 illustrates a graph of optical amplification in a semiconductor as a function of bandgap energy.

The optical gain, g, in a semiconductor is schematically illustrated in FIG. 3 as a function of bandgap energy $E_g$, for a constant charge carrier density. The amplification is highest when the bandgap energy is chosen to be slightly lower than the prevailing optical photon energy $E_O$, such as $E_A$. Such a material is therefore normally chosen for the gain section of a laser.

Charge carriers are consumed as amplification takes place, which is undesirable in a tuning section. Consequently, a material that has a higher bandgap energy $E_T$ is normally chosen for a tuning section, so that the gain will be negligible.

In the case of a semi-active coupler filter, however, the waveguide material is selected so that bandgap energy $E_{SA}$ lies just about equal to or slightly larger than the prevailing photon energy. A certain amount of optical amplification of light having a photon energy of $E_O$, therefore, occurs within the waveguide when charge carriers are present in the waveguide. Such a material enables the injection of charge carriers to cause both tuning and amplification. The bandgap energy $E_{SA}$ may be selected so that, when charge carriers are injected into the waveguide, the amplification substantially compensates for losses due to the presence of free charge carriers.

Figure 4:
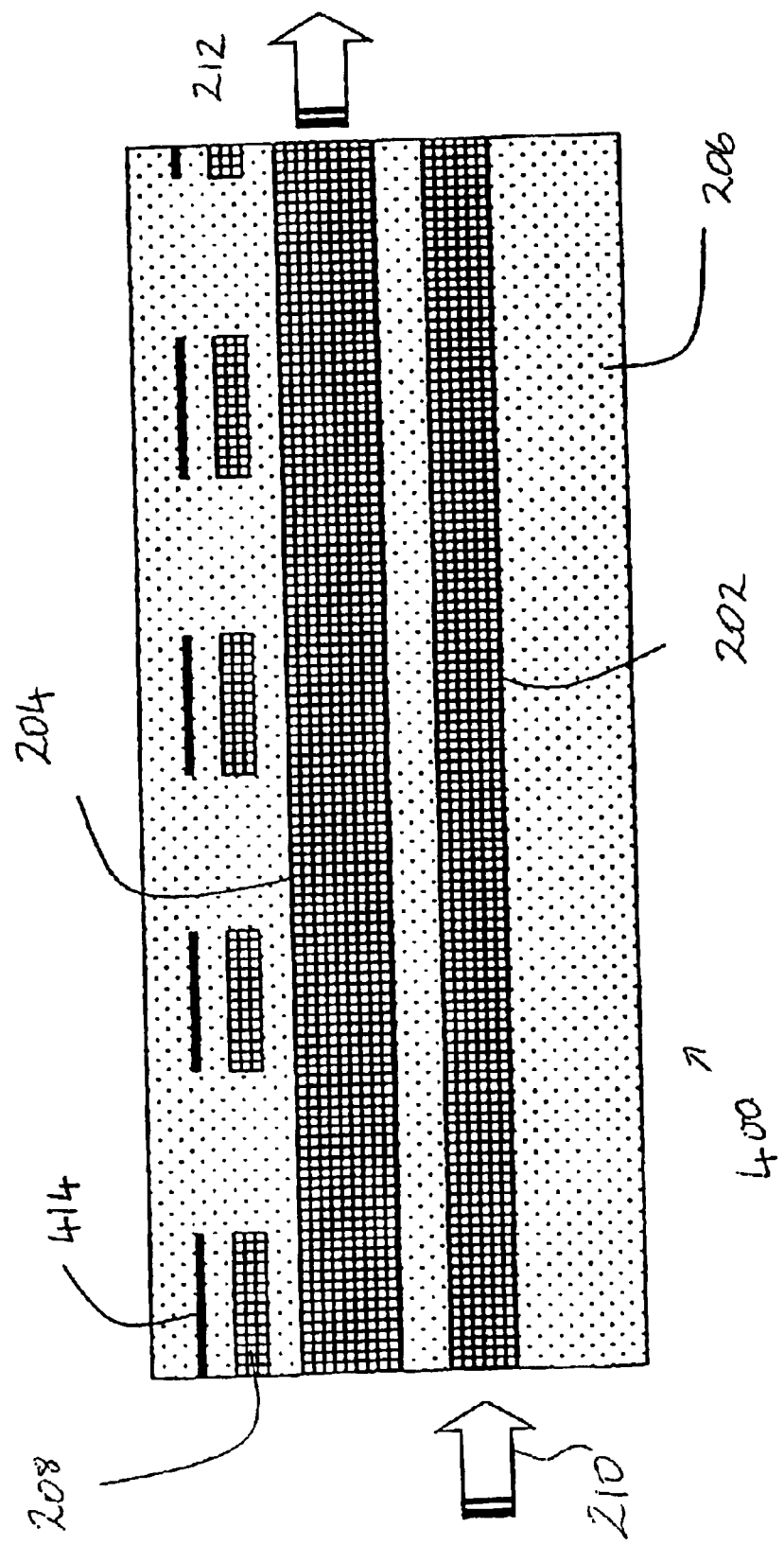
FIG. 4 schematically illustrates an example of a coupler filter that includes loss compensation, according to an embodiment of the present invention.
Figure 5:
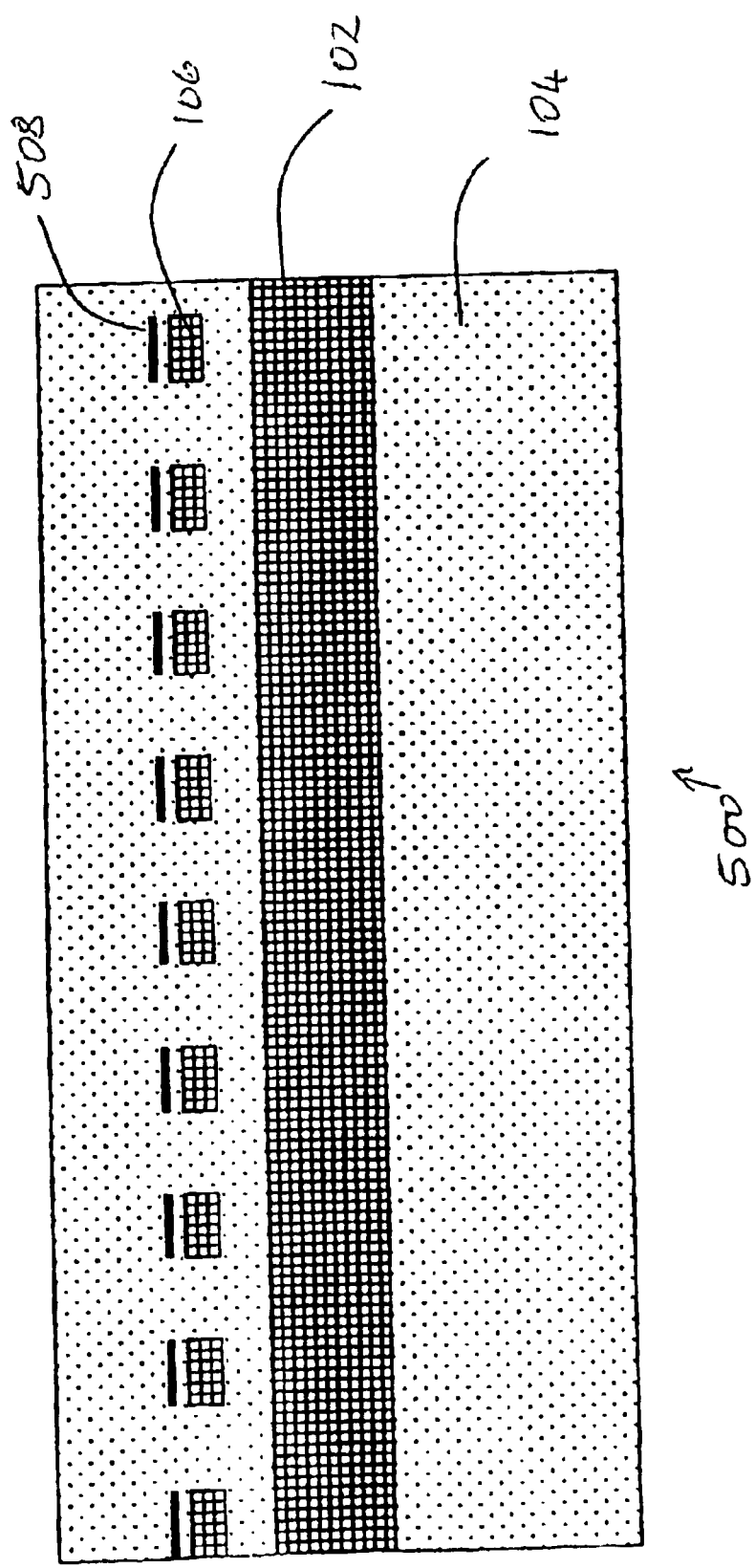
FIG. 5 schematically illustrates an example of a Bragg filter that includes loss compensation, according to an embodiment of the present invention.

The present invention relates to the compensation of losses in a tunable laser filter that includes a tuning material and an amplifying material, the tuning and amplifying materials having mutually different compositions. According to one particular embodiment of the invention, the tuning material and the amplifying material are placed parallel with one another, for example as shown in FIGS. 4 and 5 in which the amplifying material is referenced as 414 and 508 respectively. FIGS. 4 and 5 correspond show devices 400 and 500 that are respectively similar to devices 200 and 100 illustrated in FIGS. 2 and 1, but with the addition of the amplifying material 414 in FIG. 4 and the amplifying material 508 in FIG. 5.

The amplifying material 414 may cover the tuning material 204 and, optionally 208, and the amplifying material 508 may cover the tuning material 102 and optionally 106, only in discrete locations, as is seen in FIGS. 4 and 5. In each case, charge carriers are injected into both the tuning and amplifying materials simultaneously. Since the amplifying material 414 and 508 is disposed at discrete locations along the direction of the tuning material 204 and 102, the average distance between the tuning material 204 and 102, defined as the average of the closest distance between the tuning material and the amplifying material, integrated for all points along the tuning material. The distance between the amplifying material 414 and 508 and a point of the tuning material 204 and 102 that is not covered by the amplifying material 414 and 508 is greater than the distance between the amplifying material 414 and 508 and a point on the tuning material 204 and 102 that is covered by the amplifying material 414 and 508. Therefore, the average separation is greater than the shortest separation between the amplifying material 414 and 508 and the tuning material 102 and 204. Therefore, the average separation between the amplifying material 414 and 508 is greater when the amplifying material 414 and 508 is formed from discrete, separated sections than it the amplifying material were formed as a continuous section parallel to the tuning material 204 and 102.

The average separation may be selected to be greater than the diffusion length of the charge carriers. This reduces the number of charge carriers that are drained by the amplifying material 414 and 508 from the tuning material 204 and 102 because of carrier recombination in the amplifying material 414 and 508. This results in the carrier density in the tuning material 204 and 102 remaining high so as to change the refractive index of the tuning material 204 and 102 and obtain the desired wavelength tuning effect in the filter.

The present invention also relates to a tunable laser filter that includes a tunable material and an amplifying material, where the tunable and amplifying materials have mutually different compositions. As discussed above, the tuning material and the amplifying material are placed parallel to one another, wherein the amplifying material covers the tuning material solely in discrete locations, as seen in a direction perpendicular to the plane of the tuning material. In the case of the Examples shown in FIGS. 4 and 5 respectively, the amplifying material 414 and 508 covers the grating material 208 and 106. However, the extension of the amplifying material 414 and 508 may be made to be smaller or larger than the extension of the grating material 208 and 106.

Electrodes may be arranged to inject charge carriers into both the amplifying and tuning materials at the same time. Although not shown, the electrodes conventionally extend over the whole, or essentially the whole, upper surface of the devices 400 and 500.

FIG. 4 shows an example of a coupler filter 400 with loss compensation. The filter does not require a semi-active material, but uses an active amplifying material 414 that is physically separate from the tunable material 202 and 208. When charge carriers are injected, the light in the gain layer 414 is amplified so as to compensate for losses in the waveguide tuning layer 204. In this case, charge carrier density is limited in the amplifying material 414, and possibly also in those parts of the waveguide layer 204 where tuning takes place. However, some parts of the waveguide layer 204, those parts not covered by the amplifying material 414, are physically further from the amplifying material 414. Charge carriers are not drained from these parts of the waveguide layer 204 by diffusion to the amplifying material 414, and consequently the charge carrier density in the waveguide layer 204 may be controlled by current injection, so as to change the refractive index of the filter, thereby enabling the filter 400 to be tuned.

FIG. 5 shows an example of a Bragg filter 500 with loss compensation, this filter also being based on an active amplifying material 508 which is physically separated from the waveguide tuning material 102. Carrier recombination may be reduced so as to reduce the effect on the charge carrier density. In particular, it is advantageous that the length of those parts of the waveguide tuning material 102 that have no amplifying material 508 above them is sufficiently long so as to increase the separation between these parts and the amplifying material to be greater than the carrier diffusion length.

The invention has been described above with reference to a coupler filter and a Bragg filter. However, the invention can be used correspondingly in other types of lasers and structures, such as S-DBR (Sampled Distributed Bragg Reflector) reflectors, and SSG-DBR (Super-Structure Grating DBR) reflectors, or with other reflectors.

As noted above, the present invention is applicable to tunable waveguide filters, and is believed to be particularly useful for reducing losses in such filters. The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

What is claimed is:

1. A method of compensating for losses in a tunable optical filter that includes a waveguide formed from tunable material and discrete sections of an amplifying material disposed in a parallel relationship lateral to the tunable material waveguide, the tuning and amplifying materials having different compositions, the method comprising:

passing light along the tunable material waveguide; and injecting charge carriers through the tunable material and the amplifying material lateral to the tunable material waveguide at the same time, wherein a distance between at least some parts of the tunable material and the amplifying material is greater than a charge carrier diffusion length, so as to provide gain to the light as it passes along the tunable material waveguide and so as to change the refractive index of the tunable material to a desired value.

2. A method as recited in claim 1, further comprising placing the tuning material at an average distance from the amplifying material that is greater than the diffusion length of the charge carriers.

3. A method as recited in claim 1, further comprising disposing repeated lengths of amplifying material along a direction parallel to the waveguide.

4. A method as recited in claim 1, wherein the filter includes a grating structure formed of sections of grating material regularly spaced along the waveguide, and further comprising disposing the amplifying material as sections beside respective sections of grating material, the sections of amplifying material having substantially a same extent as the respective sections of the grating material.

5. A method as recited in claim 1, wherein the amplifying material has a photoluminescence wavelength of about 1.55 $\mu$m.

6. A method as recited in claim 1, wherein the filter is a frequency-selective reflector having a peak reflectivity at approximately about $\lambda=1.55$ $\mu$m.

7. A method as recited in claim 5, wherein the amplifying material is $In_{(1-X)}Ga_X As_Y P_{(1-Y)}$.

8. A tunable optical filter, comprising a tunable waveguide formed from a timing material; and an amplifying material having a composition different from the composition of the tuning material, the amplifying material disposed in multiple discrete sections in a parallel relationship lateral to the tunable waveguide so as to be capable of amplifying light at the same time as the light propagates along the tunable waveguide, portions of the tuning material being separated front the discrete sections of the amplifying material by a distance greater than a charge carrier diffusion length.

9. A filter as recited in claim 8, wherein the tuning material is disposed at an average distance from the amplifying material that is greater than the diffusion length of the charge carriers.

10. A filter as recited in claim 8, wherein the amplifying material is disposed proximate the tunable waveguide as repeated lengths of amplifying material parallel to the tunable waveguide.

11. A filter as recited in claim 8, further comprising a grating structure formed of sections of grating material regularly spaced along the tunable waveguide, the amplifying material being disposed as sections beside respective sections of grazing material, the sections of amplifying material having substantially a same extent as the respective sections of the grating material.

12. A filter as recited in claim 8, wherein the amplifying material has a photoluminescence wavelength of about 1.55 $\mu$m.

13. A filter as recited in claim 8, wherein the filter is a frequency-selective reflector having a peak reflectivity at approximately about $\lambda=1.55$ $\mu$m.

14. A filter as recited in claim 13, wherein the amplifying material is $In_{(1-X)}Ga_X As_Y P_{(1-Y)}$.

15. A filter as recited in claim 8, further comprising a second waveguide proximate the tunable waveguide so that light couples between the tunable and second waveguides.

16. A filter as recited in claim 15, further comprising a grating structure disposed proximate the tunable waveguide to frequency select the light coupled between the tunable waveguide and the second waveguide.

17. A filter as recited in claim 8, wherein the tuning material has a bandgap energy higher than the photon energy of the light propagating along tunable waveguide.

18. A filter as recited in claim 17, wherein the amplifying material has a band gap energy approximately the same as the photon energy of the light propagating along the tunable waveguide.

19. A tunable optical filter, comprising a first waveguide formed from a first waveguide material;

a second waveguide disposed parallel to and proximate the first waveguide so as to form a directional coupler filter; and an amplifying material having a composition different from the composition of the first waveguide material, the amplifying material disposed in a parallel relationship proximate the first waveguide so as to be capable of amplifying light at the same time as the light propagates along the first waveguide of the directional coupler filter.

20. A filter as recited in claim 19, wherein the waveguide material is disposed at an average distance from the amplifying material that is greater than a charge carrier diffusion length.

21. A filter as recited in claim 19, the amplifying material is disposed proximate the first waveguide as repeated lengths of amplifying material parallel to the first waveguide.

22. A filter as recited in claim 19, comprising a grating structure formed of sections of grating material regularly spaced in a direction along the first waveguide to facilitate optical coupling between the first and second waveguides, the amplifying material being disposed as sections beside respective sections of the grating material.

23. A tunable optical filter, comprising
a first waveguide formed from a first tunable waveguide material, the first waveguide having an input to receive input light;
a distributed Bragg grating disposed proximate the first waveguide so as to form a distributed Bragg reflector (DBR) filter that reflects light propagating along the first waveguide at a selected wavelength, the reflected light passing out of the first waveguide at the input;
an electrode disposed proximate the first waveguide, the selected wavelength being variable according to an amount of current passing through the first waveguide from the electrode; and
an amplifying material having a composition different from the composition of the first tunable waveguide material, the amplifying material disposed in a parallel relationship proximate the first waveguide so as to be capable of amplifying light at the same time as the light propagates along the first waveguide when a current passes from the electrode through the amplifying material.

24. A filter as recited in claim 23, wherein the waveguide material is disposed at an average distance from the amplifying material that is greater than a charge carrier diffusion length.

25. A filter as recited in claim 23, wherein the amplifying material is disposed proximate the first waveguide as repeated lengths of amplifying material parallel to the first waveguide.

26. A filter as recited in claim 23, wherein the distributed Bragg grating comprises sections of grating material, the amplifying material being disposed as sections beside respective sections of the grating material.

* * * * *